United States Patent
Liu et al.

(10) Patent No.: US 10,868,253 B2
(45) Date of Patent: Dec. 15, 2020

(54) PROCESS FOR MAKING AN ORGANIC CHARGE TRANSPORTING FILM

(71) Applicants: Dow Global Technologies LLC, Midland, MI (US); Rohm and Haas Electronic Materials LLC, Marlborough, MA (US)

(72) Inventors: Chun Liu, Midland, MI (US); Peter Trefonas, III, Marlborough, MA (US); Sukrit Mukhopadhyay, Midland, MI (US); Liam P. Spencer, Freeport, TX (US); David D. Devore, Midland, MI (US); Ashley Inman, Midland, MI (US)

(73) Assignees: Rohm and Haas Electronic Materials LLC, Marlborough, MA (US); Dow Global Technologies LLC, Midland, MI (US)

(*) Notice: Subject to any disclaimer, the term of this patent is extended or adjusted under 35 U.S.C. 154(b) by 40 days.

(21) Appl. No.: 15/768,040

(22) PCT Filed: Sep. 29, 2016

(86) PCT No.: PCT/US2016/054405
§ 371 (c)(1),
(2) Date: Apr. 13, 2018

(87) PCT Pub. No.: WO2017/065983
PCT Pub. Date: Apr. 20, 2017

(65) Prior Publication Data
US 2018/0358558 A1    Dec. 13, 2018

Related U.S. Application Data

(60) Provisional application No. 62/242,342, filed on Oct. 16, 2015.

(51) Int. Cl.
| H01L 51/00 | (2006.01) |
| H01B 1/00 | (2006.01) |
| H01B 1/12 | (2006.01) |
| C08L 65/00 | (2006.01) |
| H01L 51/50 | (2006.01) |
| H01L 51/56 | (2006.01) |

(52) U.S. Cl.
CPC ............ *H01L 51/004* (2013.01); *C08L 65/00* (2013.01); *H01B 1/12* (2013.01); *H01L 51/0007* (2013.01); *H01L 51/0035* (2013.01); *H01L 51/0043* (2013.01); *C08L 2203/16* (2013.01); *H01L 51/006* (2013.01); *H01L 51/0072* (2013.01); *H01L 51/5056* (2013.01); *H01L 51/5072* (2013.01); *H01L 51/56* (2013.01); *H01L 2251/556* (2013.01); *H01L 2251/558* (2013.01)

(58) Field of Classification Search
CPC ....... H01L 51/00; H01L 51/0003; C09D 5/24; H01B 1/12; H01B 1/121; H01B 1/20
See application file for complete search history.

(56) References Cited

U.S. PATENT DOCUMENTS

| | | | | |
|---|---|---|---|---|
| 2003/0059975 A1* | 3/2003 | Sirringhaus | ............ | B82Y 30/00 438/99 |
| 2006/0115652 A1* | 6/2006 | Yoshimoto | ........... | C09D 179/02 428/411.1 |
| 2007/0034862 A1* | 2/2007 | Parham | ............... | H01L 51/0015 257/40 |
| 2010/0243960 A1* | 9/2010 | Matsue | ............... | H01L 51/0007 252/301.35 |
| 2011/0065222 A1* | 3/2011 | Meyer | ................. | H01L 51/0003 438/46 |
| 2012/0252300 A1* | 10/2012 | Imai | .................... | H01L 51/0004 445/24 |
| 2016/0197280 A1* | 7/2016 | May | .................... | H01L 51/0007 257/40 |
| 2019/0198765 A1* | 6/2019 | Devore | ................... | H01L 51/00 |

FOREIGN PATENT DOCUMENTS

WO    WO 02/069119 A  *  9/2002

\* cited by examiner

*Primary Examiner* — Mark Kopec
(74) *Attorney, Agent, or Firm* — G. Creston Campbell

(57) ABSTRACT

A single phase liquid formulation useful for producing an organic charge transporting film; said formulation comprising: (a) a first polymer resin having $M_w$ less than 5,000; (b) a second polymer resin having $M_w$ at least 7,000; (c) a first solvent having a boiling point from 50 to 165° C.; and (d) a second solvent having a boiling point from 180 to 300° C.

14 Claims, No Drawings

PROCESS FOR MAKING AN ORGANIC CHARGE TRANSPORTING FILM

FIELD OF THE INVENTION

The present invention relates to a process for preparing an organic charge transporting film.

BACKGROUND OF THE INVENTION

There is a need for an efficient process for manufacturing an organic charge transporting film for use in a flat panel organic light emitting diode (OLED) display. Solution processing is one of the leading technologies for fabricating large flat panel OLED displays by deposition of OLED solution onto a substrate to form a thin film followed by cross-linking and polymerization. Currently, solution processable polymeric materials are cross-linkable organic charge transporting compounds with medium molecular weight ($M_w$). For example, US2008/0226941 discloses polymerization of a resin having $M_w$ of at least 10,000 in an organic solvent. However, this reference does not disclose the formulation described herein.

SUMMARY OF THE INVENTION

The present invention provides a single liquid phase formulation useful for producing an organic charge transporting film; said formulation comprising: (a) a first polymer resin having $M_w$ less than 5,000; (b) a second polymer resin having $M_w$ at least 7,000; (c) a first solvent having a boiling point from 50 to 165° C.; and (d) a second solvent having a boiling point from 180 to 300° C.

DETAILED DESCRIPTION OF THE INVENTION

Percentages are weight percentages (wt %) and temperatures are in ° C., unless specified otherwise. Operations were performed at room temperature (20-25° C.), unless specified otherwise. Boiling points are measured at atmospheric pressure (ca. 101 kPa). Molecular weights are determined by Size Exclusion Chromatography using polystyrene standards. A "polymer resin" is a monomer, oligomer or polymer which can be cured to form a cross-linked film. Preferably the polymer resins have at least two groups per molecule which are polymerizable by addition polymerization. Examples of polymerizable groups include an ethenyl group (preferably attached to an aromatic ring), benzocyclobutenes, acrylate or methacrylate groups, trifluorovinylether, cinnamate/chalcone, diene, ethoxyethyne and 3-ethoxy-4-methylcyclobut-2-enone. Preferred resins contain at least one of the following structures

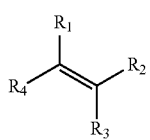

Ethenyl (at least one of $R_1$, $R_2$, $R_3$, $R_4$ preferably attached to an aromatic ring)

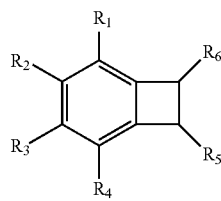

Benzocyclobutene

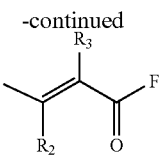

Acrylate ($R_3$ = H) and Methacrylate ($R_3$ = $CH_3$)

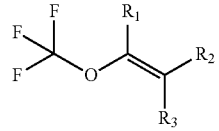

Trifluorovinylether

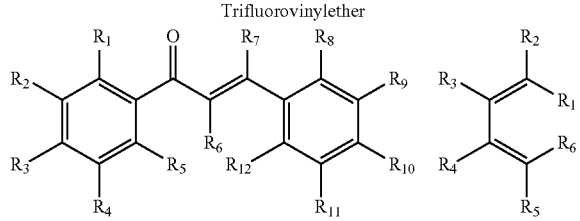

Cinnamate/Chalcone          Butadiene

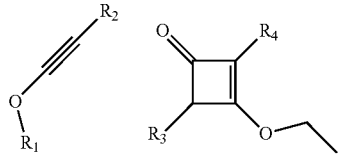

Ethoxyethyne    3-Ethoxycyclobut-2-enone where "R" groups independently are hydrogen, deuterium, $C_1$-$C_{30}$ alkyl, hetero-atom substituted $C_1$-$C_{30}$ alkyl, $C_1$-$C_{30}$ aryl, hetero-atom substituted $C_1$-$C_{30}$ aryl or represent another part of the resin structure; preferably hydrogen, deuterium, $C_1$-$C_{20}$ alkyl, hetero-atom substituted $C_1$-$C_{20}$ alkyl, $C_1$-$C_{20}$ aryl, hetero-atom substituted $C_1$-$C_{20}$ aryl or represent another part of the resin structure; preferably hydrogen, deuterium, $C_1$-$C_{10}$ alkyl, hetero-atom substituted $C_1$-$C_{10}$ alkyl, $C_1$-$C_{10}$ aryl, hetero-atom substituted $C_1$-$C_{10}$ aryl or represent another part of the resin structure; preferably hydrogen, deuterium, $C_1$-$C_4$ alkyl, hetero-atom substituted $C_1$-$C_4$ alkyl, or represent another part of the resin structure. In one preferred embodiment of the invention, "R" groups may be connected to form fused ring structures.

An "organic charge transporting compound" is a material which is capable of accepting an electrical charge and transporting it through the charge transport layer. Examples of charge transporting compounds include "electron transporting compounds" which are charge transporting compounds capable of accepting an electron and transporting it through the charge transport layer, and "hole transporting compounds" which are charge transporting compounds capable of transporting a positive charge through the charge transport layer. Preferably, organic charge transporting compounds. Preferably, organic charge transporting compounds have at least 50 wt % aromatic rings (measured as the molecular weight of all aromatic rings divided by total molecular weight; non-aromatic rings fused to aromatic rings are included in the molecular weight of aromatic rings), preferably at least 60%, preferably at least 70%, preferably at least 80%, preferably at least 90%. Preferably the resins are organic charge transporting compounds.

In a preferred embodiment of the invention, some or all materials used, including solvents and resins, are enriched in deuterium beyond its natural isotopic abundance. All compound names and structures which appear herein are intended to include all partially or completely deuterated analogs.

Preferably, the first polymer resin has $M_w$ at least 100, preferably at least 200, preferably at least 300, preferably at least 400, preferably at least 500, preferably at least 600, preferably at least 700, preferably at least 800; preferably no greater than 4,000, preferably no greater than 3,000, preferably no greater than 2,000, preferably no greater than 1,500, preferably no greater than 1,200, preferably no greater than 1,100. Preferably, the first polymer resin comprises at least 60% (preferably at least 80%, preferably at least 95%) monomers which contain at least five aromatic rings, preferably at least six; other monomers not having this characteristic may also be present. Preferably, the resin comprises at least 60% (preferably at least 75%) monomers which contain at least one of triarylamine, carbazole, and fluorene ring systems.

Preferably, the second polymer resin has $M_w$ at least 8,000, preferably at least 9,000, preferably at least 10,000; preferably no greater than 200,000, preferably no greater than 100,000, preferably no greater than 50,000, preferably no greater than 40,000, preferably no greater than 30,000, preferably no greater than 20,000, preferably no greater than 15,000. Preferably, the second polymer resin comprises at least 60% (preferably at least 80%, preferably at least 95%) polymerized monomers which contain at least five aromatic rings, preferably at least six; other monomers not having this characteristic may also be present. Preferably, the resin comprises at least 50% (preferably at least 70%) polymerized monomers which contain at least one of triarylamine, carbazole and fluorene ring systems.

Preferably, the polymer resins are at least 99% pure, as measured by liquid chromatography/mass spectrometry (LC/MS) on a solids basis, preferably at least 99.5%, preferably at least 99.7%. Preferably, the formulation of this invention contains no more than 10 ppm of metals, preferably no more than 5 ppm.

Monomers which are useful as first polymer resins or as polymerized components of the second polymer resin include, e.g., Monomers A, B and C, which are described in Example 1 below, as well as the following structures with at least one aryl-H substituted by the polymerizable group.

B1)

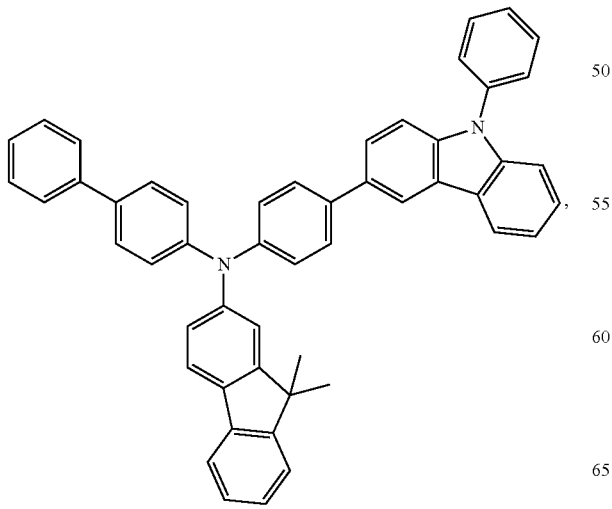

B2)

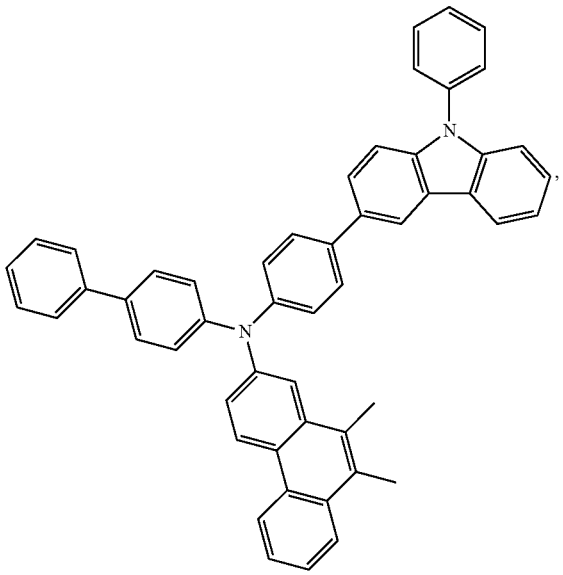

B3)

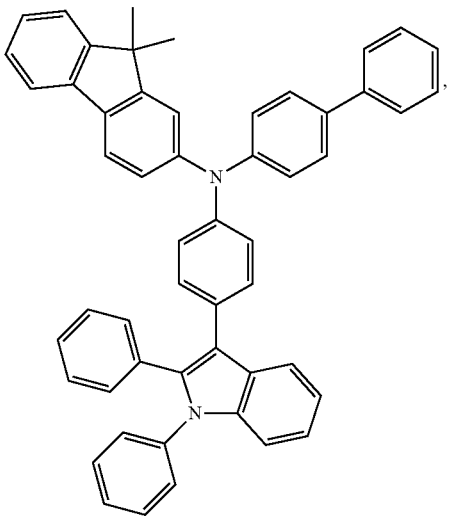

B4)

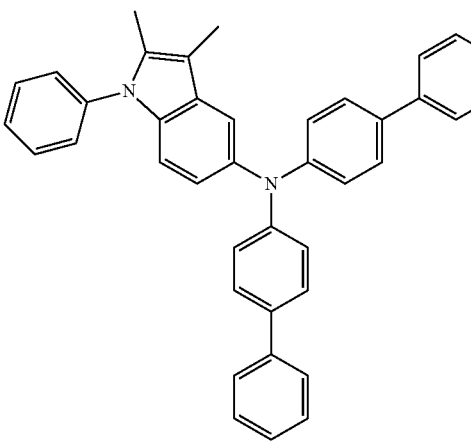

-continued

B5)

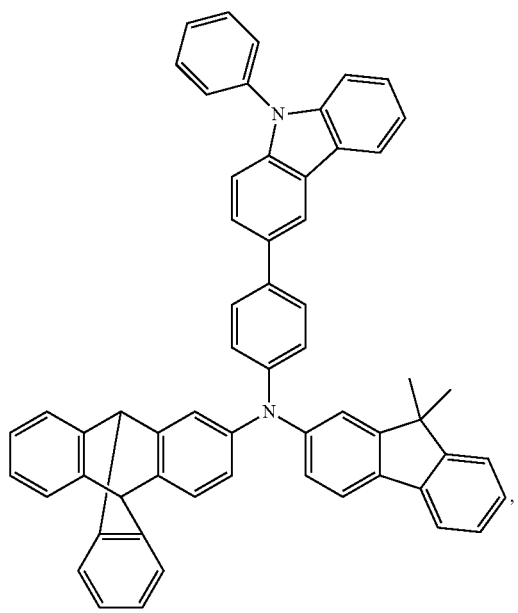

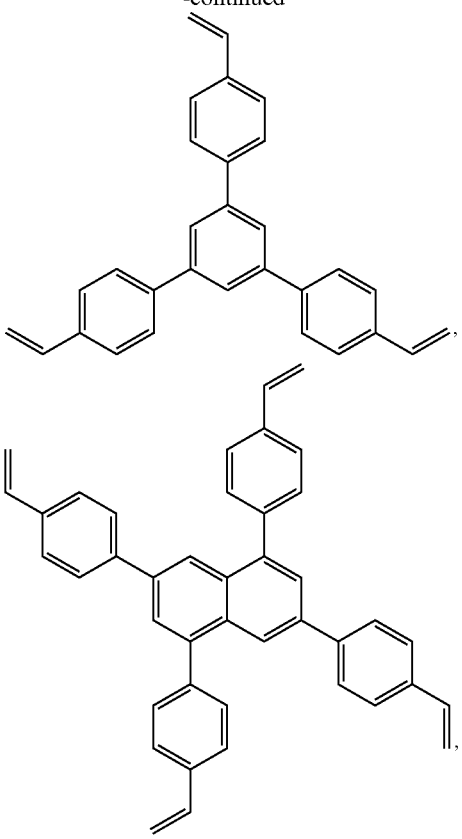

Crosslinking agents which are not necessarily charge transporting compounds may be included in the formulation as well. Preferably, these crosslinking agents have at least 60 wt % aromatic rings (as defined previously), preferably at least 70%, preferably at least 75 wt %. Preferably, the crosslinking agents have from three to five polymerizable groups, preferably three or four. Preferably, the polymerizable groups are ethenyl groups attached to aromatic rings preferred crosslinking agents are shown below

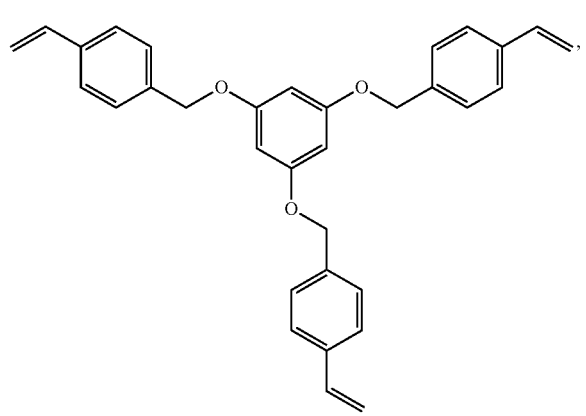

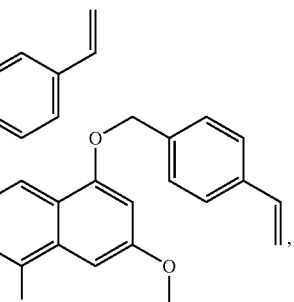

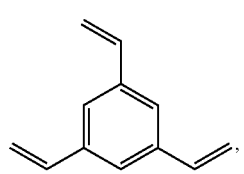

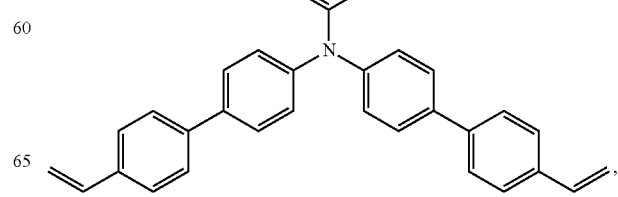

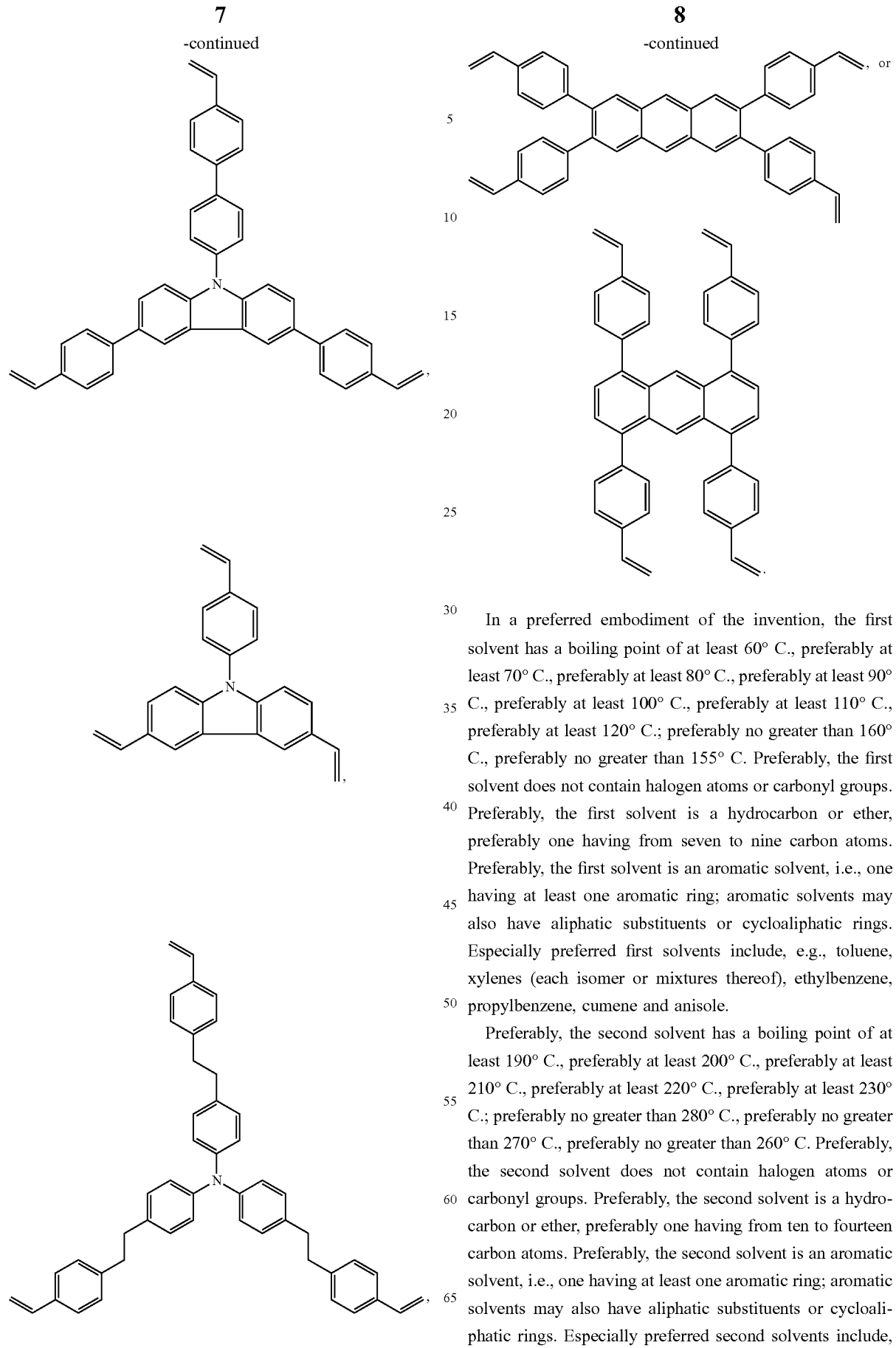

In a preferred embodiment of the invention, the first solvent has a boiling point of at least 60° C., preferably at least 70° C., preferably at least 80° C., preferably at least 90° C., preferably at least 100° C., preferably at least 110° C., preferably at least 120° C.; preferably no greater than 160° C., preferably no greater than 155° C. Preferably, the first solvent does not contain halogen atoms or carbonyl groups. Preferably, the first solvent is a hydrocarbon or ether, preferably one having from seven to nine carbon atoms. Preferably, the first solvent is an aromatic solvent, i.e., one having at least one aromatic ring; aromatic solvents may also have aliphatic substituents or cycloaliphatic rings. Especially preferred first solvents include, e.g., toluene, xylenes (each isomer or mixtures thereof), ethylbenzene, propylbenzene, cumene and anisole.

Preferably, the second solvent has a boiling point of at least 190° C., preferably at least 200° C., preferably at least 210° C., preferably at least 220° C., preferably at least 230° C.; preferably no greater than 280° C., preferably no greater than 270° C., preferably no greater than 260° C. Preferably, the second solvent does not contain halogen atoms or carbonyl groups. Preferably, the second solvent is a hydrocarbon or ether, preferably one having from ten to fourteen carbon atoms. Preferably, the second solvent is an aromatic solvent, i.e., one having at least one aromatic ring; aromatic solvents may also have aliphatic substituents or cycloaliphatic rings. Especially preferred second solvents include, e.g., tetralin, n-butyl phenyl ether, cyclohexylbenzene, 1-methylnaphthalene, diphenyl ether and 1-ethylnaphthalene.

Preferably, the weight % of the second solvent based on total weight of first and second solvents is from 0.5% to 60%; preferably at least 1%, preferably at least 2%, preferably at least 5%; preferably no higher than 50%, preferably no higher than 40%, preferably no higher than 30%, preferably no higher than 20%, preferably no higher than 10%.

Preferably, each of the first and second solvents has a purity of at least 99.8%, as measured by gas chromatography-mass spectrometry (GC/MS), preferably at least 99.9%.

Preferably, the percent solids of the formulation, i.e., the percentage of monomers and polymers relative to the total weight of the formulation, is from 0.2 to 20 wt %; preferably at least 0.5 wt %, preferably at least 1 wt %, preferably at least 1.5 wt %; preferably no more than 15 wt %, preferably no more than 10 wt %, preferably no more than 7 wt %, preferably no more than 4 wt %.

The present invention is further directed to an organic charge transporting film and a process for producing it by coating the formulation on a surface, preferably another organic charge transporting film, and Indium-Tin-Oxide (ITO) glass or a silicon wafer. The film is formed by coating the formulation on a surface, baking at a temperature from 50 to 150° C. (preferably 80 to 130° C.), followed by thermal cross-linking at a temperature from 130 to 210° C. (preferably 150 to 200° C. Preferably, the cured film is baked to remove high-boiling solvent, preferably at a temperature from 200 to 250° C. (preferably 200 to 225° C.).

Preferably, the thickness of the polymer films produced according to this invention is from 1 nm to 100 microns, preferably at least 10 nm, preferably at least 30 nm, preferably no greater than 10 microns, preferably no greater than 1 micron, preferably no greater than 300 nm. The spin-coated film thickness is determined mainly by the solid contents in solution and the spin rate. For example, at a 2000 rpm spin rate, 2, 5, 8 and 10 wt % polymer resin formulated solutions result in the film thickness of 30, 90, 160 and 220 nm, respectively. The wet film shrinks by 5% or less after baking and cross-linking.

EXAMPLES

Examples of Low and High Boiling Point Solvents

| Solvent Name | Type | B.P. (° C.) | D | P | H | RED | M.P. (° C.) |
|---|---|---|---|---|---|---|---|
| Low boiling point solvent |||||||||
| anisole | Aromatic Ether | 154 | 17.8 | 4.1 | 6.7 | 0.51 | −37 |
| o-xylene | Aromatic | 144 | 17.8 | 1 | 3.1 | 0.91 | −24 |
| toluene | Aromatic | 111 | 18.0 | 1.4 | 2.0 | 1.00 | −95 |
| High boiling point solvent |||||||||
| tetralin | Aromatic, Hydrogenated | 206 | 19.6 | 2.0 | 2.9 | 1.22 | −36 |
| cyclohexylbenzene | Aromatic, cyclo-alkyl | 234 | 19.34 | 0.9 | 2.23 | 1.34 | 5 |
| 1-methyl naphthalene | Aromatic, N-alkyl | 245 | 19.7 | 0.8 | 4.7 | 1.34 | −30 |
| diphenyl ether | Aromatic Ether | 254 | 19.6 | 3.2 | 5.8 | 1.05 | 25 |
| 1-ethyl naphthalene | Aromatic, N-alkyl | 259 | N/A | N/A | N/A | Soluble | 15 |

D: Dispersion cohesion parameter in the unit of (MPa)^0.5;
P: Polar cohesion parameter in the unit of (MPa)^0.5;
H: Hydrogen bonding cohesion parameter in the unit of (MPa)^0.5;
RED: Relative Energy Difference.
The details on the theory of Hansen Solubility Parameter and its application can be found in the book of "Hansen Solubility Parameters - A User's Handbook"CRC Press, 2000.

Example 1 High MW Polymer Film from Solvent Mixture of Monomers A, B & C

Monomer A has the Following Structure

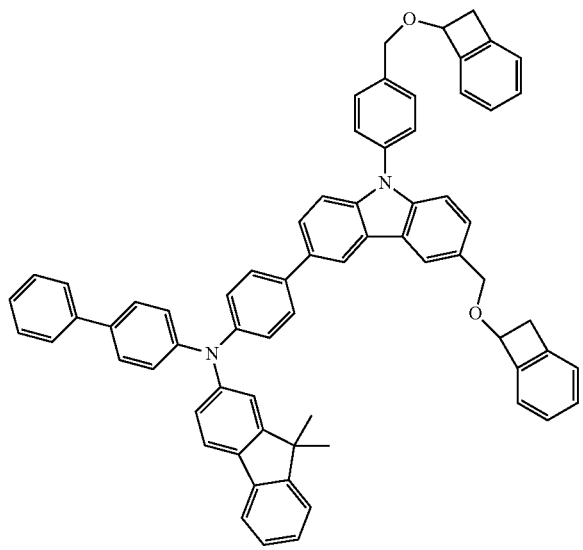 [SMILES: CC1(C)c2ccccc2-c2ccc(N(c3ccc(-c4ccccc4)cc3)c3ccc(-c4ccc5c(c4)c4cc(COC6Cc7ccccc76)ccc4n5-c4ccc(COC5Cc6ccccc65)cc4)cc3)cc21]

Monomer B has the Following Structure:

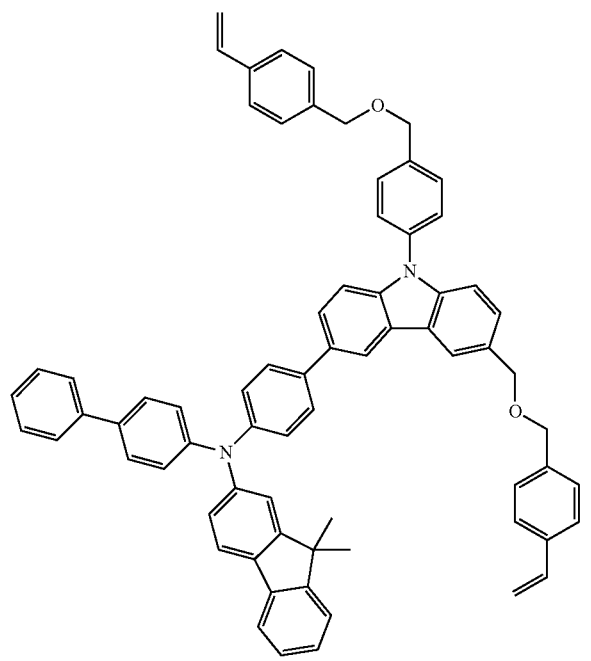 [SMILES: C=Cc1ccc(COCc2ccc(-n3c4ccc(COCc5ccc(C=C)cc5)cc4c4cc(-c5ccc(N(c6ccc(-c7ccccc7)cc6)c6ccc7c(c6)C(C)(C)c6ccccc6-7)cc5)ccc43)cc2)cc1]

Monomer C has the Following Structure

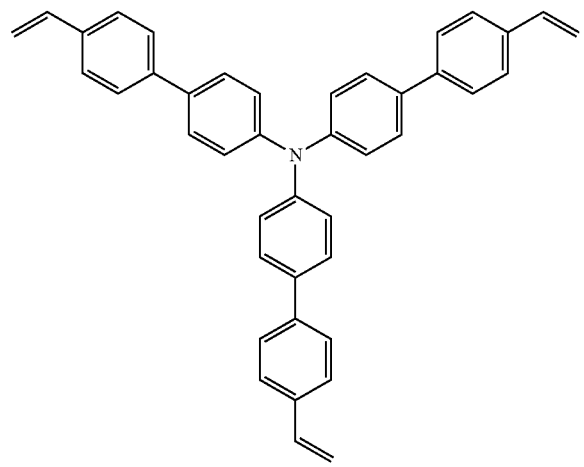 [SMILES: C=Cc1ccc(-c2ccc(N(c3ccc(-c4ccc(C=C)cc4)cc3)c3ccc(-c4ccc(C=C)cc4)cc3)cc2)cc1]

The molecular weight of the polymer made from Monomers A, B & C was determined:

| MW (Da) | $M_n$ | $M_w$ | $M_z$ | $M_{z+1}$ | PDI |
|---|---|---|---|---|---|
| High MW polymer from A, B&C | 4,111 | 11,497 | 31,177 | 93,790 | 2.80 |

1) Preparation of high MW polymer resin from Monomers A, B & C: Polymer solid powders were directly dissolved into mixture of high and low boiling point solvents with desired compositions to make a 2 wt % solution. The resulting solution was filtered though 0.2 μm PTFE syringe filter prior to depositing onto Si wafer.
2) Preparation of thermally cross-linked polymer film: Si wafer was pre-treated by UV-ozone for 2 min prior to use. Several drops of the above filtered solution were deposited onto the pre-treated Si wafer. The thin film was obtained by spin coating at 500 rpm for 5 s and then 2000 rpm for 30 s. The resulting film was then transferred into the $N_2$ purging box. The "wet" film was prebaked at 100° C. for 1 min to remove most of residual low boiling point solvent. Subsequently, the film was thermally cross-linked at 170° C. for 15 to 60 min or 190° C. for 5 to 20 min, followed by post-baking at 205° C. for 1 min to remove residual high boiling point solvent from the film.

3) Strip test on thermally cross-linked polymer film: The "Initial" thickness of thermally cross-linked film was measured using an M-2000D ellipsometer (J. A Woollam Co., Inc.). Then, several drops of anisole were added onto the film to form a puddle. Alter 90 s, the anisole solvent was spun off at 3500 rpm for 30 s. The "Strip" thickness of the film was immediately measured using the ellipsometer. The film was then transferred into the $N_2$ purging box, followed by post-baking at 100° C. for 1 min to remove any swollen anisole in the film. The "Final" thickness was measured using the ellipsometer. The film thickness was determined using Cauchy model and averaged over 9=3×3 points in a 1 cm×1 cm area.

Purity and halide analyses of the anisole and tetralin used in these examples were as follows:

|  | purity | halide | metal |
|---|---|---|---|
| anisole | 100% | 0.44 ppm | 9.85 ppb |
| tetralin | 100% | <5 ppm* | <20 ppb* |

*specification limits

Strip tests were applied for studying the effect of thermal cross-linking conditions on degree of cross-linking of the polymer films in presence of high boiling point tetralin. As shown in the table below, the presence high boiling point tetralin helps reducing the film loss in strip test, indicating higher degree of cross-linking. It is also found that higher cross-linking temperature and higher level of high boiling point tetralin result in even lower film loss.

| Temp (° C.)/ Time(min) | Initial Thickness (nm) | Final Thickness (nm) | Film Loss (nm) |
|---|---|---|---|
| Ref: Thin Film of High MW Polymer (A, B& C) from Pure Anisole Solvent | | | |
| 170/15 | 30.15 ± 0.13 | 19.47 ± 0.29 | −10.68 |
| 170/30 | 29.96 ± 0.44 | 22.02 ± 0.23 | −7.94 |
| 170/60 | 30.43 ± 0.53 | 23.14 ± 0.49 | −7.29 |
| 205/5 | 29.76 ± 0.13 | 25.78 ± 0.14 | −3.98 |
| 205/10 | 29.81 ± 0.18 | 25.86 ± 0.16 | −3.95 |
| 205/20 | 29.79 ± 0.07 | 25.92 ± 0.19 | −3.87 |
| Thin Film of High MW Polymer (A, B& C) from Solvent Mixture of Anisole and Tetralin (98:2) | | | |
| 170/15 | 31.25 ± 0.09 | 24.67 ± 0.11 | −6.58 |
| 170/30 | 31.07 ± 0.03 | 24.32 ± 0.06 | −6.75 |
| 170/60 | 30.82 ± 0.06 | 24.14 ± 0.08 | −6.68 |
| 190/5 | 33.40 ± 0.17 | 27.37 ± 0.16 | −6.03 |
| 190/10 | 33.75 ± 0.16 | 27.64 ± 0.19 | −6.11 |
| 190/20 | 33.71 ± 0.04 | 27.72 ± 0.14 | −5.99 |
| Thin Film of High MW Polymer (A, B& C) from Solvent Mixture of Anisole and Tetralin (95:5) | | | |
| 170/15 | 31.25 ± 0.05 | 24.97 ± 0.10 | −6.28 |
| 170/30 | 31.30 ± 0.06 | 24.88 ± 0.05 | −6.42 |
| 170/60 | 31.10 ± 0.25 | 24.90 ± 0.24 | −6.20 |

-continued

| Temp (° C.)/ Time(min) | Initial Thickness (nm) | Final Thickness (nm) | Film Loss (nm) |
|---|---|---|---|
| 190/5 | 33.59 ± 0.33 | 27.59 ± 0.19 | −6.00 |
| 190/10 | 33.19 ± 0.05 | 27.21 ± 0.14 | −5.98 |
| 190/20 | 33.45 ± 0.17 | 27.52 ± 0.10 | −5.93 |
| Thin Film of High MW Polymer (A, B& C) from Solvent Mixture of Anisole and Tetralin (90:10) | | | |
| 170/15 | 30.26 ± 0.45 | 24.24 ± 0.35 | −6.02 |
| 170/30 | 29.64 ± 0.16 | 23.71 ± 0.11 | −5.93 |
| 170/60 | 29.73 ± 0.22 | 23.91 ± 0.24 | −5.82 |
| 190/5 | 28.93 ± 0.08 | 23.77 ± 0.16 | −5.16 |
| 190/10 | 29.11 ± 0.09 | 24.05 ± 0.06 | −5.06 |
| 190/20 | 29.48 ± 0.08 | 24.69 ± 0.13 | −4.79 |

A variety of high boiling point solvents were also screened for their effect on degree of cross-linking of the polymer films after thermal cross-linking at 190 C for 15 min. As shown in the table below, the degree of cross-linking tends to increase with boiling point and loading level of high boiling point solvent.

| Anisole:High boiling solvent weight ratio | Initial Thickness (nm) | Final Thickness (nm) | Film Loss (nm) |
|---|---|---|---|
| Thin Film of High MW Polymer (Monomer A, B, C) from Solvent Mixture of Anisole and Cycloheptanone | | | |
| 100/0 | 41.36 ± 0.18 | 33.70 ± 0.13 | −7.66 |
| 95/5 | 40.67 ± 0.07 | 34.13 ± 0.16 | −6.54 |
| 75/25 | 42.62 ± 0.08 | 36.09 ± 0.06 | −6.53 |
| Thin Film of High MW Polymer (A, B& C) from Solvent Mixture of Anisole and Tetralin | | | |
| 100/0 | 41.36 ± 0.18 | 33.70 ± 0.13 | −7.66 |
| 95/5 | 41.53 ± 0.06 | 33.93 ± 0.08 | −7.60 |
| 75/25 | 39.52 ± 0.09 | 32.54 ± 0.22 | −6.98 |
| 50/50 | 33.86 ± 0.34 | 28.19 ± 0.27 | −5.67 |
| Thin Film of High MW Polymer (A, B& C) from Solvent Mixture of Anisole and Cyclohexylbenzene | | | |
| 100/0 | 41.36 ± 0.18 | 33.70 ± 0.13 | −7.66 |
| 95/5 | 33.30 ± 0.14 | 27.38 ± 0.14 | −5.92 |
| 75/25 | 32.16 ± 0.12 | 26.75 ± 0.24 | −5.41 |
| 50/50 | 26.24 ± 0.35 | 22.35 ± 0.29 | −3.89 |
| Thin Film of High MW Polymer (A, B& C) from Solvent Mixture of Anisole and Diphenyl Ether | | | |
| 100/0 | 41.36 ± 0.18 | 33.70 ± 0.13 | −7.66 |
| 95/5 | 35.47 ± 0.03 | 29.12 ± 0.10 | −6.35 |
| 75/25 | 31.82 ± 0.15 | 25.92 ± 0.14 | −5.90 |
| 50/50 | 24.62 ± 1.49 | 20.08 ± 0.92 | −4.54 |
| Thin Film of High MW Polymer (A, B& C) from Solvent Mixture of Anisole and 1-Ethyl Naphthalene | | | |
| 100/0 | 41.36 ± 0.18 | 33.70 ± 0.13 | −7.66 |
| 95/5 | 35.47 ± 0.03 | 29.12 ± 0.10 | −6.35 |
| 90/10 | 38.00 ± 0.08 | 31.81 ± 0.09 | −6.19 |

Example 2 High MW Cross-Linked Polymer A Film Born Solvent Mixture

Polymer A has the following structure and the molecular weight was as follows

| MW (Da) | $M_n$ | $M_w$ | $M_z$ | $M_{z+1}$ | PDI |
|---|---|---|---|---|---|
| High MW Polymer A | 19,941 | 56,004 | 126,177 | 218,454 | 2.81 |

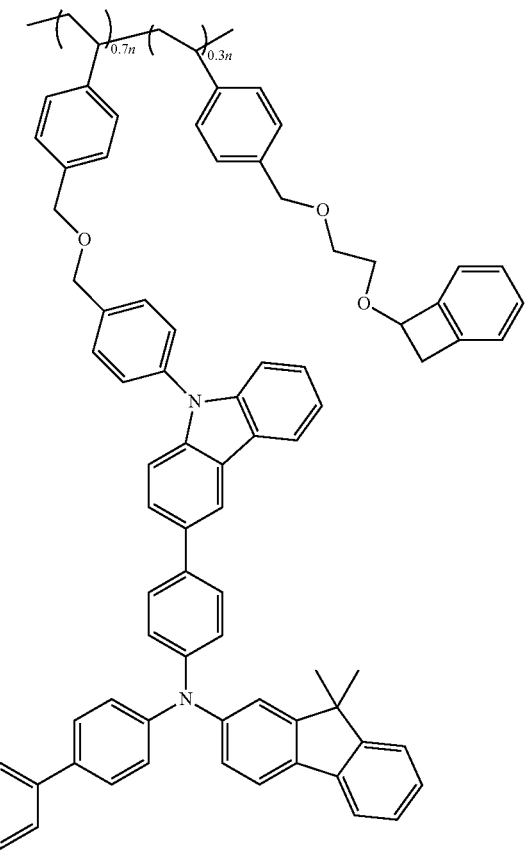

1) Peparation of high MW Polymer A solutions: Polymer solid powders were directly dissolved into mixture of low boiling point anisole and high boiling point tetralin with anisole to tetralin weight ratio of 90 to 10 to make a 2 wt % solution. The resulting solution was filtered through 0.2 μm PTFE syringe filter prior to depositing onto Si wafer.
2) Preparation of thermally cross-linked Polymer A polymer film: Si wafer was pre-treated by UV-ozone for 2 min prior to use. Several drops of the above filtered solution were deposited onto the pre-treated Si wafer. The thin film was obtained by spin coating at 500 rpm for 5 s and then 2000 rpm for 30 s. The resulting film was then transferred into the $N_2$ purging box. The "wet" film was prebaked at 100° C. for 1 min to remove most of residual low boiling point anisole. Subsequently, the film was thermally cross-linked at 190° C. for 5 to 40 min. The reference Polymer A films were also prepared following the above protocol, expect that no tetralin was added into solution and the thermal cross-linking was done at 205° C./5 to 20 min for cross-linking.
3) Strip test on thermally cross-linked Polymer A film: The "Initial" thickness of thermally cross-linked film was measured using an M-2000D ellipsometer (J. A. Woollam Co., Inc.). Then, several drops of anisole were added onto the film to form a puddle. After 90 s, the anisole solvent was spun off at 3500 rpm for 30 s. The "Strip" thickness of the film was immediately measured using the ellipsometer. The film was then transferred into the $N_2$ purging box, followed by post-baking at 100° C. for 1 min to remove any swollen anisole in the film. The "Final" thickness was measured using the ellipsometer. The film thickness was determined using Cauchy model and averaged over 9=3×3 points in a 1 cm×1 cm area.

Strip tests were applied for studying the cross-linking of Polymer A films upon introduction of tetralin as a high boiling point solvent. As shown in the table below, the presence of 10 wt % tetralin helps reducing the film loss to ca. 1 nm loss after 190° C./≥20 min thermal linking, indicating a fully cross-linked film. This performance is comparable with Polymer A cross-linking at 205° C. in the absence of high boiling point solvent additive. Therefore, the high boiling point tetralin successfully reduces the full cross-linking temperature by 15° C., which is desirable for manufacturing as low cross-linking temperature is always preferred.

| Temp (° C.)/ Time(min) | Initial Thickness (nm) | Final Thickness (nm) | Film Loss (nm) |
|---|---|---|---|
| Ref: Thin Film of High MW Polymer A from Pure Anisole Solvent | | | |
| 205/5 | 33.48 ± 0.20 | 32.69 ± 0.16 | −0.79 |
| 205/10 | 33.32 ± 0.07 | 32.42 ± 0.10 | −0.90 |
| 205/20 | 33.03 ± 0.11 | 32.30 ± 0.11 | −0.73 |
| Thin Film of High MW Polymer A from Solvent Mixture of Anisole and Tetralin (90:10 wt:wt) | | | |
| 190/05 | 35.47 ± 0.33 | 33.47 ± 0.12 | −2.00 |
| 190/10 | 35.94 ± 0.15 | 34.60 ± 0.23 | −1.34 |
| 190/20 | 35.52 ± 0.05 | 34.50 ± 0.15 | −1.02 |
| 190/40 | 35.56 ± 0.27 | 34.40 ± 0.28 | −1.16 |

Example 3: Anisotropy of High Polymer Films Horn Monomers A, B & C

Anisotropy measurements on A, B & C polymer films: Ellipsometer was applied to analyze the anisotropy of film after thermal cross-linking and before strip test (M-2000D ellipsometer, J. A. Woollam Co., Inc.). The anisotropy index, $n_o-n_e$, was obtained via step-by-step modeling, starting from Cauchy model, to B-Spline model and finally to anisotropic Gen-Osc model, and averaged over 9=3×3 points in a 1 cm×1 cm area.

As shown in the table below, the presence of high boiling point solvents helps increasing the anisotropy of cross-linked A, B & C films. It is found that significantly higher anisotropy can be obtained at higher loading level of higher boiling point solvent, which is desirable for charge mobility enhancement.

| Anisole:High boiling solvent weight ratio | $n_o-n_e$ (632.8 nm) Avg | $n_o-n_e$ (632.8 nm) Stdev |
|---|---|---|
| Ref: Thin Film of High MW Polymer (A, B & C) from Pure Anisole Solvent | | |
| 100/0 | 0.02773 | 0.00690 |
| Thin Film of High MW Polymer (Monomer A, B, C) from Solvent Mixture of Anisole and Cycloheptanone | | |
| 95/5 | 0.02817 | 0.00354 |
| 75/25 | 0.02220 | 0.00102 |
| Thin Film of High MW Polymer (A, B & C) from Solvent Mixture of Anisole and Tetralin | | |
| 95/5 | 0.02585 | 0.00152 |
| 75/25 | 0.04111 | 0.00719 |
| 50/50 | 0.04682 | 0.00963 |
| Thin Film of High MW Polymer (A, B & C) from Solvent Mixture of Anisole and Cyclohexylbenzene | | |
| 95/5 | 0.05022 | 0.00676 |
| 75/25 | 0.06005 | 0.00681 |
| 50/50 | 0.12370 | 0.00560 |
| Thin Film of High MW Polymer (A, B & C) from Solvent Mixture of Anisole and Diphenyl Ether | | |
| 95/5 | 0.03847 | 0.00241 |
| 75/25 | 0.05500 | 0.00941 |
| 50/50 | 0.13357 | 0.02686 |
| Thin Film of High MW Polymer (A, B & C) from Solvent Mixture of Anisole and 1-Ethyl Naphthalene | | |
| 95/5 | 0.04120 | 0.00256 |
| 90/10 | 0.04176 | 0.00808 |

The specification limits for the cyclohexylbenzene, diphenyl ether and 1-ethylnaphthalene used in these examples were as follows:

| | purity | halide | metal |
|---|---|---|---|
| cyclohexylbenzene | 100% | <5 ppm | <20 ppb |
| diphenyl ether | 100% | <5 ppm | <20 ppb |
| 1-ethylnaphthalene | 100% | <5 ppm | <20 ppb |

Example 4: Low MW Monomer B+High MW Monomers A, B & C Film from Anisole

The purities of Monomers A, B and C and the polymer made from them were as follows:

| | Purity, % |
|---|---|
| Monomer A | 99.7 |
| Monomer B | 99.5 |
| Monomer C | 99.6 |
| Polymer of A, B & C | 99.6 |

1) Peparation of solutions: Solid powders of low MW Monomer B and high MW polymer from Monomers A, B & C (Monomer B:high MW polymer=75:25 wt:wt) were directly dissolved into anisole to make a 2 wt % solution. The resulting solution was filtered though 0.2 μm PTFE syringe filter prior to depositing onto Si wafer.
2) Peparation of thermally cross-linked film: Si wafer was pre-treated by UV-ozone for 2 min prior to use. Several drops of the above filtered solution were deposited onto the pre-treated Si wafer. The thin film was obtained by spin coating at 500 rpm for 5 s and then 2000 rpm for 30 s. The resulting film was then transferred into the $N_2$ purging box. The "wet" film was prebaked at 100° C. for 1 min to remove most of residual anisole. Subsequently, the film was thermally cross-linked at 170° C. for 15, 30 min, or 190° C. for 10, 20 min, or 205° C./5, 10 min. The reference high MW polymer films from Monomers A, B & C were also prepared following the above protocol.
3) Strip test on thermally cross-linked low MW Monomer B and high MW polymer from Monomers A, B &C film:

The "Initial" thickness of thermally cross-linked film was measured using an M-2000D ellipsometer (J. A Woollam Co., Inc.). Then, several drops of anisole were added onto the film to form a puddle. After 90 s, the anisole solvent was spun off at 3500 rpm for 30 s. The "Strip" thickness of the film was immediately measured using the ellipsometer. The film was then transferred into the $N_2$ purging box, followed by post-baking at 100° C. for 1 min to remove any swollen anisole in the film. The "Final" thickness was measured using the ellipsometer. The film thickness was determined using Cauchy model and averaged over 9=3×3 points in a 1 cm×1 cm area.

Strip tests were applied for comparing the cross-linking of low MW Monomer B and high MW polymer from Monomers A, B & C films vs. high MW polymer from Monomers A, B & C films alone. As shown in the table below, the combination films give significantly less the film loss than high MW polymer from Monomers A, B & C films alone after the same thermal cross-linking process. The fully cross-linked film can be achieved at 205° C. for 10 min for the combination films; while high MW polymer from Monomers A, B & C films alone still give ca. 4 nm loss at the same cross-linking temperature.

| Temp (° C.)/ Time(min) | Initial Thickness (nm) | Final Thickness (nm) | Film Loss (nm) |
|---|---|---|---|
| Ref: Thin Film of High MW Polymer (A, B& C) from Pure Anisole Solvent | | | |
| 170/15 | 30.15 ± 0.13 | 19.47 ± 0.29 | −10.68 |
| 170/30 | 29.96 ± 0.44 | 22.02 ± 0.23 | −7.94 |
| 170/60 | 30.43 ± 0.53 | 23.14 ± 0.49 | −7.29 |
| 205/5 | 29.76 ± 0.13 | 25.78 ± 0.14 | −3.98 |
| 205/10 | 29.81 ± 0.18 | 25.86 ± 0.16 | −3.95 |
| 205/20 | 29.79 ± 0.07 | 25.92 ± 0.19 | −3.87 |
| Thin Film of Low MW Monomer B + High MW Polymer (A, B& C) from Pure Anisole Solvent | | | |
| 170/30 | 35.79 ± 0.16 | 29.52 ± 0.15 | −6.27 |
| 190/20 | 35.67 ± 0.13 | 33.94 ± 0.26 | −1.73 |
| 205/10 | 35.55 ± 0.12 | 34.86 ± 0.17 | −0.69 |

Example 5: Low MW Monomer B+High MW Monomers A, B & C Film from Solvent Mixture

1) Peparation of solution: Solid powders of low MW Monomer B and high MW Monomers A, B & C polymer (Monomer B:high MW polymer=75:25 wt:wt) were directly dissolved into mixture of low boiling point anisole and high boiling point tetralin, cyclohexylbenzene or 1-ethylnaphthalene with anisole to high boiling point solvent weight ratio of 95 to 5, 75 to 25 or 50:50 to make a 2 wt % solution. The resulting solution was filtered through 0.2 μm PTFE syringe filter prior to depositing onto Si wafer.
2) Peparation of thermally cross-linked film: Si wafer was pre-treated by UV-ozone for 2 min prior to use. Several drops of the above filtered solution were deposited onto the pre-treated Si wafer. The thin film was obtained by spin coating at 500 rpm for 5 s and then 2000 rpm for 30 s. The resulting film was then transferred into the $N_2$ purging box. The "wet" film was prebaked at 100° C. for 1 min to remove most of residual low boiling point anisole. Subsequently, the film was thermally cross-linked at 190° C. for 15 min. The reference film was also prepared following the above protocol, except that no high boiling point solvent was added into solution and the thermal cross-linking was done at 190° C. for 20 min for better cross-linking.
3) Strip test on thermally cross-linked film: The "Initial" thickness of thermally cross-linked film was measured using an M-2000D ellipsometer (J. A. Woollam Co., Inc.). Then, several drops of anisole were added onto the film to form a puddle. After 90 s, the anisole solvent was spun off at 3500 rpm for 30 s. The "Strip" thickness of the film was immediately measured using the ellipsometer. The film was then transferred into the $N_2$ purging box, followed by post-baking at 100° C. for 1 min to remove any swollen anisole in the film. The "Final" thickness was measured using the ellipsometer. The film thickness was determined using Cauchy model and averaged over 9=3×3 points in a 1 cm×1 cm area.

Strip tests were applied for studying the cross-linking of low MW Monomer B+High MW Monomers A, B & C Film in mixture of low boiling point and high boiling point solvents. As shown in the table below, the use of the combined resin formulation significantly reduced the film loss, regardless of the solvent composition. Furthermore, the use of high boiling point solvent enables the full cross-linking of Monomers A, B & C films at even lower temperature of 190° C./15 min, in comparison with 205° C./10 min in low boiling point anisole only (See Example 4). Therefore, the combination of low MW Monomer B in resin formulation and high boiling point solvent in solvent formulation gives the optimal cross-linking performance.

| Anisole:High boiling solvent weight ratio | Initial Thickness (nm) | Final Thickness (nm) | Film Loss (nm) |
|---|---|---|---|
| Ref: Thin Film of Low MW Monomer B + High MW Polymer (A, B& C) from Pure Anisole Solvent | | | |
| 100/0 | 35.67 ± 0.13 | 33.94 ± 0.26 | −1.73 |
| Thin Film of Low MW Monomer B + High MW Polymer (A, B& C) from Solvent Mixture of Anisole and Tetralin | | | |
| 95/5 | 40.40 ± 0.11 | 39.53 ± 0.17 | −0.87 |
| 75/25 | 39.55 ± 0.05 | 39.41 ± 0.07 | −0.14 |
| 50/50 | 34.87 ± 0.06 | 34.30 ± 0.23 | −0.57 |
| Thin Film of Low MW Monomer B + High MW Polymer (A, B& C) from Solvent Mixture of Anisole and Cyclohexylbenzene | | | |
| 95/5 | 37.30 ± 0.18 | 36.81 ± 0.26 | −0.49 |
| 75/25 | 33.36 ± 0.12 | 33.10 ± 0.13 | −0.26 |
| 50/50 | 22.05 ± 0.13 | 21.91 ± 0.21 | −0.14 |
| Thin Film of Low MW Monomer B + High MW Polymer (A, B& C) from Solvent Mixture of Anisole and 1-Ethyl Naphthalene | | | |
| 95/5 | 44.13 ± 0.19 | 43.79 ± 0.05 | −0.34 |

Example 6: Anisotropy of Low MW Monomer B+High MW Monomers A, B & C Films

Anisotropy measurements on films: Ellipsometer was applied to analyze the anisotropy of film after thermal cross-linking and before strip test (M-2000D ellipsometer, J. A. Woollam Co., Inc.). The anisotropy index, $n_o$-$n_e$, was obtained via step-by-step modeling, starting from Cauchy model, to B-Spline model and finally to anisotropic Gen-Osc model, and averaged over 9=3×3 points in a 1 cm×1 cm area.

As shown in the table below, the presence of high boiling point solvents helps increasing the anisotropy of cross-linked low MW Monomer B+High MW Monomers A, B & C films. Similar to films made only from polymer of Monomers A, B & C, significantly higher anisotropy can be obtained at higher loading level of higher boiling point solvent, which is desirable for charge mobility enhancement.

| Anisole:High boiling solvent weight ratio | n_o-n_e (632.8 nm) Avg | n_o-n_e (632.8 nm) Stdev |
|---|---|---|
| Thin Film of Low MW Monomer B + High MW Polymer (A, B& C) from Solvent Mixture of Anisole and Tetralin | | |
| 100/0 | 0.03694 | 0.01337 |
| 95/5 | 0.02406 | 0.00467 |
| 75/25 | 0.02851 | 0.00251 |
| 50/50 | 0.04508 | 0.00144 |
| Thin Film of Low MW Monomer B + High MW Polymer (A, B& C) from Solvent Mixture of Anisole and Cyclohexylbenzene | | |
| 100/0 | 0.03694 | 0.01337 |
| 95/5 | 0.02887 | 0.00910 |
| 75/25 | 0.04868 | 0.00627 |
| 50/50 | 0.08541 | 0.00931 |

The invention claimed is:

1. A single liquid phase formulation useful for producing an organic charge transporting film; said formulation comprising: (a) a first crosslinkable polymer resin having $M_w$ less than 5,000; (b) a second crosslinkable polymer resin having $M_w$ at least 7,000; (c) a first solvent having a boiling point from 50 to 165° C.; and (d) a second solvent having a boiling point from 180 to 300° C.

2. The formulation of claim 1 in which the first crosslinkable polymer resin has $M_w$ from 300 to 3,000.

3. The formulation of claim 2 in which the second crosslinkable polymer resin has $M_w$ from 8,000 to 100,000.

4. The formulation of claim 3 in which the first solvent has a boiling point from 80 to 160° C.

5. The formulation of claim 4 in which the second solvent has a boiling point from 200 to 280° C.

6. The formulation of claim 5 in which weight % of the second solvent relative to total weight of first and second solvents is from 0.5% to 60%.

7. The formulation of claim 6 having a solid content from 0.2 to 20 wt %.

8. The formulation of claim 7 in which the first crosslinkable polymer resin has $M_w$ from 500 to 2,000.

9. The formulation of claim 8 in which the second crosslinkable polymer resin has $M_w$ from 8,000 to 40,000.

10. The formulation of claim 1 in which the first crosslinkable polymer resin and the second polymer resin are at least 99% pure.

11. The formulation of claim 10 in which each of total metal and total halide concentrations in the first and second solvents is no greater than 10 ppm.

12. The formulation of claim 10 in which purity of the first solvent and the second solvent is at least than 99.8%.

13. The formulation of claim 1 in which the first crosslinkable polymer and the second crosslinkable polymer resin have at least two groups per molecule which are polymerizable by addition polymerization.

14. The formulation of claim 1 in which the first and second solvents are aromatic.

* * * * *